United States Patent
Alsafran et al.

(10) Patent No.: US 12,196,818 B1
(45) Date of Patent: Jan. 14, 2025

(54) CYLINDRICAL LITHIUM-ION BATTERY ANALYZER DETERMINATION OF THE CHARGING AND DISCHARGING QUALITY CONDITION

(71) Applicant: KING FAISAL UNIVERSITY, Al-Ahsa (SA)

(72) Inventors: Ahmed Sulaiman Alsafran, Al-Ahsa (SA); Haider Aljanubi, Al-Ahsa (SA); Hussain Al Othman, Al-Ahsa (SA); Mohammed Alnowaiser, Al-Ahsa (SA); Ismael Alaithan, Al-Ahsa (SA)

(73) Assignee: KING FAISAL UNIVERSITY, Al-Ahsa (SA)

( * ) Notice: Subject to any disclaimer, the term of this patent is extended or adjusted under 35 U.S.C. 154(b) by 0 days.

(21) Appl. No.: 18/381,067

(22) Filed: Oct. 17, 2023

(51) Int. Cl.
| | |
|---|---|
| *G01R 31/392* | (2019.01) |
| *G01R 31/371* | (2019.01) |
| *G01R 31/3842* | (2019.01) |
| *H01M 10/0525* | (2010.01) |
| *H01M 10/42* | (2006.01) |
| *H01M 10/44* | (2006.01) |
| *H01M 10/48* | (2006.01) |
| *H02J 7/00* | (2006.01) |

(52) U.S. Cl.
CPC ......... *G01R 31/392* (2019.01); *G01R 31/371* (2019.01); *G01R 31/3842* (2019.01); *H01M 10/0525* (2013.01); *H01M 10/4228* (2013.01); *H01M 10/4285* (2013.01); *H01M 10/44* (2013.01); *H01M 10/48* (2013.01); *H02J 7/005* (2020.01)

(58) Field of Classification Search
CPC .......... G01R 31/3842; G01R 31/392; G01R 31/371; H02J 7/005; H01M 10/0525; H01M 10/4228; H01M 10/4285; H01M 10/44; H01M 10/48
USPC ...... 324/425–434, 444–450, 76.11, 500, 600
See application file for complete search history.

(56) References Cited

U.S. PATENT DOCUMENTS

| | | | |
|---|---|---|---|
| 7,072,871 B1 | 7/2006 | Tinnemeyer | |
| 2003/0193317 A1* | 10/2003 | Shimamura | H01M 50/178 320/116 |
| 2016/0064972 A1* | 3/2016 | Stefanopoulou | H02J 7/0013 324/426 |
| 2017/0153292 A1* | 6/2017 | Steiber | G01R 31/3648 |
| 2022/0384858 A1* | 12/2022 | Bertness | G01R 31/396 |

(Continued)

FOREIGN PATENT DOCUMENTS

CN 115792637 A 3/2023

OTHER PUBLICATIONS

Watthour, "Full review of XH-M240 18650 Lithium Battery Capacity Tester Discharger", Youtube video, First available online Jan. 5, 2021.

(Continued)

*Primary Examiner* — Huy Q Phan
*Assistant Examiner* — Trung Q Nguyen
(74) *Attorney, Agent, or Firm* — Nath, Goldberg & Meyer; Joshua B. Goldberg

(57) ABSTRACT

A cylindrical lithium-ion battery analyzer which can be used to determine the charging and discharging quality and conditions of used lithium-ion rechargeable batteries. The analyzer can be used in methods for determining battery health and selecting those batteries capable of being reused.

12 Claims, 17 Drawing Sheets

(56) References Cited

U.S. PATENT DOCUMENTS

2023/0182575 A1* 6/2023 Kim .................. G06Q 50/40
701/22

OTHER PUBLICATIONS

Vippo Tech, "Cell capacity & Ir testing machine / Nokoser brand / WhatsApp 8770421226 @ VippoTech", Youtube video, First available online Dec. 13, 2022.

Ty Battery, "4 slot battery capacity tester charger to test True Real Capacity of 26650 18650 AA AAA Battery", Youtube video, First available online May 28, 2015.

Bad Idea Metals, "Improved Battery Testing: 18650 Cell Processing for Homemade Batteries", Youtube video, First available online Jan. 7, 2022.

* cited by examiner

CYLINDRICAL LITHIUM-ION BATTERY ANALYZER DETERMINATION OF THE CHARGING AND DISCHARGING QUALITY CONDITION

BACKGROUND

1. Field

The present disclosure relates to a lithium-ion battery analyzer which can be used to perform several tests including determining the charging and discharging quality and conditions of used lithium-ion rechargeable batteries.

2. Description of the Related Art

Lithium batteries are one of the most important modern energy sources currently used in most electronic devices. However, current mining operations around the globe are unable to produce enough lithium and other essential minerals to satisfy the rapidly increasing demand for these batteries. The fact that devices are continually updated as a result of the technological revolution means that some lithium-ion batteries, along with the older devices being replaced, are uselessly disposed of when they should not be. Also, the batteries in some devices may need to be replaced more quickly if they are used frequently and intensively. These batteries contain toxic materials such as lithium, cobalt, and nickel, which are all materials that can only be obtained by mining. However, mining brings about several environmental issues that have sparked protests against new mines, such as the depletion of regional water supplies and the pollution of the surrounding area by runoff debris.

There are a lot of hazards regarding the disposition of lithium-ion batteries. Lithium-ion batteries carry the risk of fire and explosion in cases of overcharging, over-discharging, excess current, or short circuits. The design of fire prevention systems still lacks any standards or test criteria. A subsidiary of the nonprofit National Fire Protection Association (NFPA), the Fire Protection Research Foundation is wrapping up research on fire suppression, including risk management of lithium secondary batteries and sprinkler design, in the US. Testing of such systems are currently in its initial stages. Hence, the battery protection circuit is necessary for battery safety; safety design is essential if safety fails at one level. A battery protection circuit will improve safety by making such accidents less likely or by minimizing them.

Over the past few decades, the widespread adoption of high-energy, portable, rechargeable lithium-ion batteries has reduced the rising power requirements of electronic devices and automobiles. On the other hand, the lithium-ion battery recycling process also needs regular care because raw materials are so expensive. Lithium-ion battery (LIB) recycling tries to recover various components of the batteries, including Li, Ni, Co, Mn, Al, and Cu. This is essential as, for example, only 5% of LIB were recycled in the UK in 2016; the remaining 95% were disposed of in landfills.

There is no documented LIB standard operating procedure in the US. Because there are so many different types of batteries, recycling must be done using different procedures to minimize risk. In 2012, the EU set a minimum LIB collection rate of 25%; by 2016, it was 45%. By 2015, twelve nations in the European Economic Area had a recycling rate of 45%, 2015 saw a 71% LIB collection rate in Switzerland. As a result, the LIB recycling process needs to be given careful thought.

To increase LIB's sustainability, a standardized recycling process is essential to gather the most valuable battery components and achieve separation to the maximum extent possible under an acceptable component purity, using the majority or at least a portion of the expanded LIB.

Currently, there are three processes that typically make up the LIB recycling process: pre-treatment, secondary treatment, and further treatment. The pre-treatment primarily focuses on fully discharging the battery and disassembling it by hand. The secondary treatment includes comminution and first-time separation, which are primarily driven by different physical properties of the cell. The further treatment employs a wide range of physical and chemical techniques to achieve the best separation and recycling rates.

The recycling process contains different techniques; hence it contains a lot of advantages and disadvantages. Certain approaches might need to be manually disassembled first to ensure safety. Numerous laboratory studies contend that electrodes should be distinguished and gathered before secondary treatment. Since this process could be very time and labor-intensive in industrial practice, few examples were seen. The battery shell, electrodes, electrolyte, adhesives, and separator are often the end results of pre-treatment.

Many batteries are thrown away every year without sorting for recyclable cells within the battery, which adds more hazards to the environment because batteries have materials such as cobalt, nickel, and manganese. Thus, if these harmful materials leak out of landfills, they can contaminate water sources and ecosystems. Also, improper lithium-ion battery disposal is one of the reasons for fires in landfills or battery recycling plants. As a result, there are regulations to maintain the huge number of these batteries.

Currently, all battery types in California must be recycled and cannot be disposed of as solid waste. However, according to LINDA L. GAINES of Argonne National Laboratory, "There are many reasons why Li-ion battery recycling is not yet a universally well-established practice, reasons include technical constraints, economic barriers, logistic issues, and gaps in legislation." Hence, recycling is not yet a perfect solution. Therefore, the number of the thrown away batteries must be decreased until recycling becomes a more efficient solution.

Thus, new solutions for dealing with used lithium-ion batteries and solving the aforementioned problems are desired.

SUMMARY

The present subject matter is directed to a lithium-ion battery analyzer used to identify lithium-ion batteries that can be reused. In an embodiment, the first stage starts by visually inspecting the battery, looking for any liquid leakage. This stage will ensure that only batteries that might be in good condition pass through to the next stage. Also, the visual inspection will enhance the safety of the analyzer as it is extremely dangerous to perform some tests on extremely bad batteries.

In the next stage, the analyzer will perform a fast electrical test on each battery cell to quickly identify those batteries that have a higher chance of being in good condition.

The final test will perform much deeper electrical and thermal tests to provide more certain information about the battery health including, for example, battery capacity, thermal characteristics, and current characteristics. At the end of the process, the analyzer will label these values for each analyzed battery individually.

Accordingly, the present subject matter relates to a method of determining battery health of a cylindrical lithium-ion battery, the method comprising: visually inspecting the cylindrical lithium-ion battery for liquid leakage; discarding the cylindrical lithium-ion battery if the cylindrical lithium-ion battery is determined to have liquid leakage and restarting the method with another cylindrical lithium-ion battery; inserting the cylindrical lithium-ion battery inside a lithium-ion battery analyzer device; detecting for a presence of the cylindrical lithium-ion battery in the lithium-ion battery analyzer device via an IR sensor housed within the lithium-ion battery analyzer device; sending a detection message from the IR sensor to a microcontroller; moving the cylindrical lithium-ion battery to connect to a positive terminal and a negative terminal of the lithium-ion battery analyzer device; performing a voltage test on the cylindrical lithium-ion battery to determine if the cylindrical lithium-ion battery is still capable of holding a charge; discarding the cylindrical lithium-ion battery if the determination result is that the cylindrical lithium-ion battery cannot hold a charge and restarting the method with a different cylindrical lithium-ion battery; fully charging and then discharging the cylindrical lithium-ion battery while measuring a voltage difference between the positive terminal and the negative terminal of the cylindrical lithium-ion battery; measuring a voltage difference between a positive terminal and a negative terminal of a known power resistor during the discharging step; calculating and comparing current and power during time for completion of the discharging steps of the cylindrical lithium-ion battery and the known power resistor to determine charge capacity of the cylindrical lithium-ion battery; performing additional tests on the cylindrical lithium-ion battery during the charging and discharging; and analyzing all results of the additional tests via the microcontroller to determine the battery health of the cylindrical lithium-ion battery.

In another embodiment, the present subject matter relates to a method of selecting a cylindrical lithium-ion battery having remaining usable battery life, the method comprising: visually inspecting the cylindrical lithium-ion battery for liquid leakage; discarding the cylindrical lithium-ion battery if the cylindrical lithium-ion battery is determined to have liquid leakage and restarting the method with another cylindrical lithium-ion battery; inserting the cylindrical lithium-ion battery inside a lithium-ion battery analyzer device; detecting for a presence of the cylindrical lithium-ion battery in the lithium-ion battery analyzer device via an IR sensor housed within the lithium-ion battery analyzer device; sending a detection message from the IR sensor to a microcontroller; moving the cylindrical lithium-ion battery to connect to a positive terminal and a negative terminal of the lithium-ion battery analyzer device; performing a voltage test on the cylindrical lithium-ion battery to determine if the cylindrical lithium-ion battery is still capable of holding a charge; discarding the cylindrical lithium-ion battery if the determination result is that the cylindrical lithium-ion battery cannot hold a charge and restarting the method with a different cylindrical lithium-ion battery; fully charging and then discharging the cylindrical lithium-ion battery while measuring a voltage difference between the positive terminal and the negative terminal of the cylindrical lithium-ion battery; measuring a voltage difference between a positive terminal and a negative terminal of a known power resistor during the discharging step; calculating and comparing current and power during time for completion of the discharging steps of the cylindrical lithium-ion battery and the known power resistor to determine charge capacity of the cylindrical lithium-ion battery; performing additional tests on the cylindrical lithium-ion battery during the charging and discharging; analyzing all results of the additional tests via the microcontroller to determine a battery health of the cylindrical lithium-ion battery; and selecting the cylindrical lithium-ion battery for further use if the battery health of the cylindrical lithium-ion battery is above a preset threshold.

These and other features of the present subject matter will become readily apparent upon further review of the following specification.

DETAILED DESCRIPTION OF THE PREFERRED EMBODIMENTS

Figure 1:
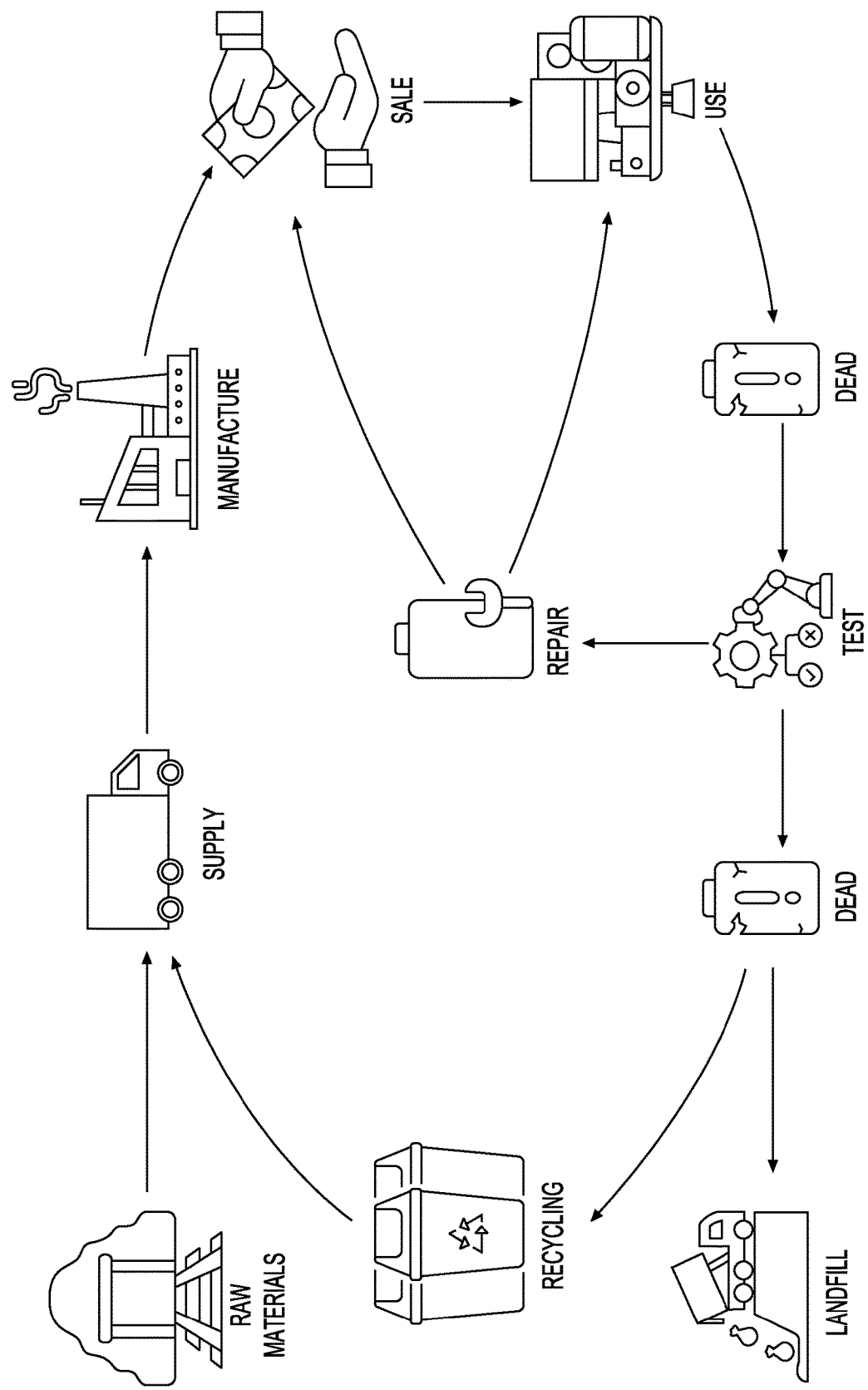
FIG. 1 shows the current lifecycle of most lithium-ion batteries.

The following definitions are provided for the purpose of understanding the present subject matter and for construing the appended patent claims.

Definitions

Throughout the application, where compositions are described as having, including, or comprising specific components, or where processes are described as having, including, or comprising specific process steps, it is contemplated that compositions of the present teachings can also consist essentially of, or consist of, the recited components, and that the processes of the present teachings can also consist essentially of, or consist of, the recited process steps.

It is noted that, as used in this specification and the appended claims, the singular forms "a", "an", and "the" include plural references unless the context clearly dictates otherwise.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

The term "optional" or "optionally" means that the subsequently described event or circumstance may or may not occur, and that the description includes instances where said event or circumstance occurs and instances in which it does not.

Unless defined otherwise, all technical and scientific terms used herein have the same meaning as commonly understood to one of ordinary skill in the art to which the presently described subject matter pertains.

Where a range of values is provided, it is understood that each intervening value, to the tenth of the unit of the lower limit, unless the context clearly dictates otherwise, between the upper and lower limit of that range and any other stated or intervening value in that stated range, is encompassed within the described subject matter. The upper and lower limits of these smaller ranges may independently be included in the smaller ranges, and such embodiments are also encompassed within the described subject matter, subject to any specifically excluded limit in the stated range. Where the stated range includes one or both of the limits, ranges excluding either or both of those included limits are also included in the described subject matter.

Throughout the application, descriptions of various embodiments use "comprising" language. However, it will be understood by one of skill in the art, that in some specific instances, an embodiment can alternatively be described using the language "consisting essentially of" or "consisting of".

For purposes of better understanding the present teachings and in no way limiting the scope of the teachings, unless otherwise indicated, all numbers expressing quantities, percentages or proportions, and other numerical values used in the specification and claims, are to be understood as being modified in all instances by the term "about". Accordingly, unless indicated to the contrary, the numerical parameters set forth in the following specification and attached claims are approximations that may vary depending upon the desired properties sought to be obtained. At the very least, each numerical parameter should at least be construed in light of the number of reported significant digits and by applying ordinary rounding techniques.

FIGS. 3-8 show a lithium-ion battery analyzer (100) as described herein. At the top of the lithium-ion battery analyzer (100), there is a battery testing inlet (110) for inserting a plurality of cylindrical lithium-ion batteries (105) to be tested as described herein. At the front of the lithium-ion battery analyzer (100), there is a touch screen (115) and a good battery outlet (125). The touch screen (115) can display the battery data such as, but not limited to, the battery health of the cylindrical lithium-ion battery (105), the capacity of the cylindrical lithium-ion battery (105), the temperature curve of the cylindrical lithium-ion battery (105), assessment of the battery health, the charging current and voltage curve of the cylindrical lithium-ion battery (105), the discharging current and voltage curve of the cylindrical lithium-ion battery (105), and the temperature curve of the cylindrical lithium-ion battery (105) as described herein. If the battery health of the cylindrical lithium-ion battery (105) is determined to be in good condition after passing all the tests as described herein, then the battery is ejected into the good battery outlet (125) as a good cylindrical lithium-ion battery (120). However, if the battery health of the cylindrical lithium-ion battery (105) is determined to be in an unusable condition (damaged) after failing all the tests as described herein, then the battery is ejected into the unusable battery outlet (140) as an unusable cylindrical lithium-ion battery (135). At the side of the lithium-ion battery analyzer (100), there is a motherboard (130) embedded within the lithium-ion battery analyzer (100).

FIGS. 9-16 show electrical schematic diagrams for the lithium-ion battery analyzer (100). While one of ordinary skill in the electrical art would understand all the components labeled in the diagrams as shown in FIGS. 9-16, some of those components will be described herein. In this embodiment, the ESP-32S module of a microcontroller is the main brain of the operation in which it reads data from the other components and controls them. The interaction of the ESP-32S module is bi-directional, which makes all decisions. A charge discharge controller is responsible for charging and discharging the battery, reading voltage, current, and battery temperature during charging and discharging as described herein. The charge discharge controller is a bi-directional interaction.

Besides the Charg_Trig pin (Charging trigger pin), and M_C pin (Mosfet Control pin), there is also a communication protocol which is being used to transfer data from the charge discharge controller I2C communication protocol returning, by way of non-limiting example, voltage, temperature, and Charging IC states. Back converter adjustable 1 and back converter adjustable 2 of the back converter are used for efficiently decreasing the 12V input voltage to a suitable voltage for supplying various kinds of servo motors. The back converter adjustable 1 and back converter adjustable 2 involve a one-way interaction which take power from an input connector and supply the power to the servo motors.

The RGB LED matrix is an addressable LED matrix which is used for the working status of the lithium-ion battery analyzer (100). The RGB LED matrix provides a one-way interaction signal coming from the microcontroller to the RGB LED matrix. Input power and connectors are connected to external 5V and 12V power supplies to power the whole system. The input power and connectors have a one-way interaction.

The extra GPIOs are being used internally in the lithium-ion battery analyzer (100) itself. Some the extra GPIOs are connected to an integrated SPI or used for connecting the system with Wi-Fi and to reset the microcontroller. The extra GPIOs interact internally with the ESP-32S module. Descriptions of some of the GPIOs and their functions are shown in Table 1 below.

The push button menu is an alternative input component which can be used for selecting mode, turning on/off the lithium-ion battery analyzer (100), and resetting the lithium-ion battery analyzer (100). One-way buttons of the push button menu are directly connected to the microcontroller GPIOs. A buzzer is an output device which can be used for determining the status of the lithium-ion battery analyzer (100) and reporting errors. The buzzer has a one-way interaction directly connected to the microcontroller GPIO_23.

A display connector is designed to be used with the touch screen (115) which is used as the main input/output device in the system. The display connector has a bi-directional interaction. The display connector uses UART Communication protocol (TX, RX) which is connected directly to the micro controller UART GPIOs. A 128×64 px I2C display is used for displaying some data, which does not necessarily need to be included on the main display. The 128×64 px I2C display has a bi-directional interaction. It can use I2C Communication protocol (SDA, SCL) connected directly to micro controller I2C pins.

A real time clock is a small system working on an external 3 V battery. It provides the microcontroller with real-time date as the lithium-ion battery analyzer (100) is turned on. The real time clock has a bi-directional interaction. It uses I2C Communication protocol (SDA, SCL) connected directly to micro controller I2C pins.

The mounting holes in the PCB are used for securing the PCB (main motherboard) to the lithium-ion battery analyzer (100) body. SW1-SW3 are switches. SCL is a serial clock. M_C_1, M_C_2, M_C_3 are signal wires going from the microcontroller to the three parallel charge discharge controller, which is used for controlling the discharge curve as described herein. There is a one-way interaction from the microcontroller to the charge discharge controller. The microcontroller uses pulse with modulation technology (PWM) to control the discharge curve. Charg_Trig_1, Charg_Trig_2, and Charg_Trig_3 are signal wires going from the microcontroller to the three parallel charge discharge controller for selecting the mode. The Charg_Trig_1, Charg_Trig_2, Charg_Trig_3 signal wires also toggle the charge discharge controller to charging mode or discharging mode as described herein.

The microcontroller sends (0, LOW) to activate charging mode and (1, HIGH) to activate discharging mode. D_LED is a signal wire coming from the microcontroller going to the RGB LED matrix used for controlling the LEDs inside the RGB LED matrix component. There is a one-way interaction from the microcontroller to the RGB LED matrix to individually control each led color and brightness using WS2812 protocol (neuron protocol). U4, U8, and U18 are optocouplers used for isolating and protecting the microcontroller from a relay inductor. The U4, U8, U18 are one-way interaction which take signal from the microcontroller and controlling the relay. D2, D3, D4 are diodes used as protection feature. L2 and L5 are inductors which are essential components in a step-down voltage converter. U23 and U25 are diodes which are essential components in the step-down voltage converter.

TABLE 1

Identification of GPIOs and their functions

| Pin number | Pin type | Function |
| --- | --- | --- |
| 1 | GPIO 06 | Connected to the integrated SPI flash |
| 2 | GPIO 07 | Connected to the integrated SPI flash |
| 3 | GPIO 08 | Connected to the integrated SPI flash |
| 4 | GPIO 15 | WPU |
| 6 | GPIO 00 | Pulled LOW once while programming |
| 10 | GPIO 05 | WPU |
| 16 | GPIO 01 | Debug output at boot & WPU |
| 21 | EN | Enable |
| 35 | GPIO 09 | Connected to the integrated SPI flash |
| 36 | GPIO 10 | Connected to the integrated SPI flash |
| 37 | GPIO 11 | Connected to the integrated SPI flash |

Hereinafter, the process of determining battery health of a cylindrical lithium-ion battery (105) will be described.

The present subject matter is directed to a lithium-ion battery analyzer (100) used to identify batteries that can be reused. In an embodiment, the first stage starts by visually inspecting the battery, looking for any liquid leakage. This stage will ensure that only batteries that might still be good pass through to the next stage. Also, this stage will enhance the safety of the device as it is very dangerous to perform some tests on extremely bad batteries, as the extremely bad batteries could explode or start a fire.

In the next stage, the lithium-ion battery analyzer (100) will perform a fast electrical test on each battery cell to quickly identify those batteries that have a higher chance of still being in good condition.

The final test will perform much deeper electrical and thermal tests to provide more certain information about the battery health including, for example, battery capacity, thermal characteristics, and current characteristics. At the end of the process, the device will label these values for each battery individually.

Figure 2:
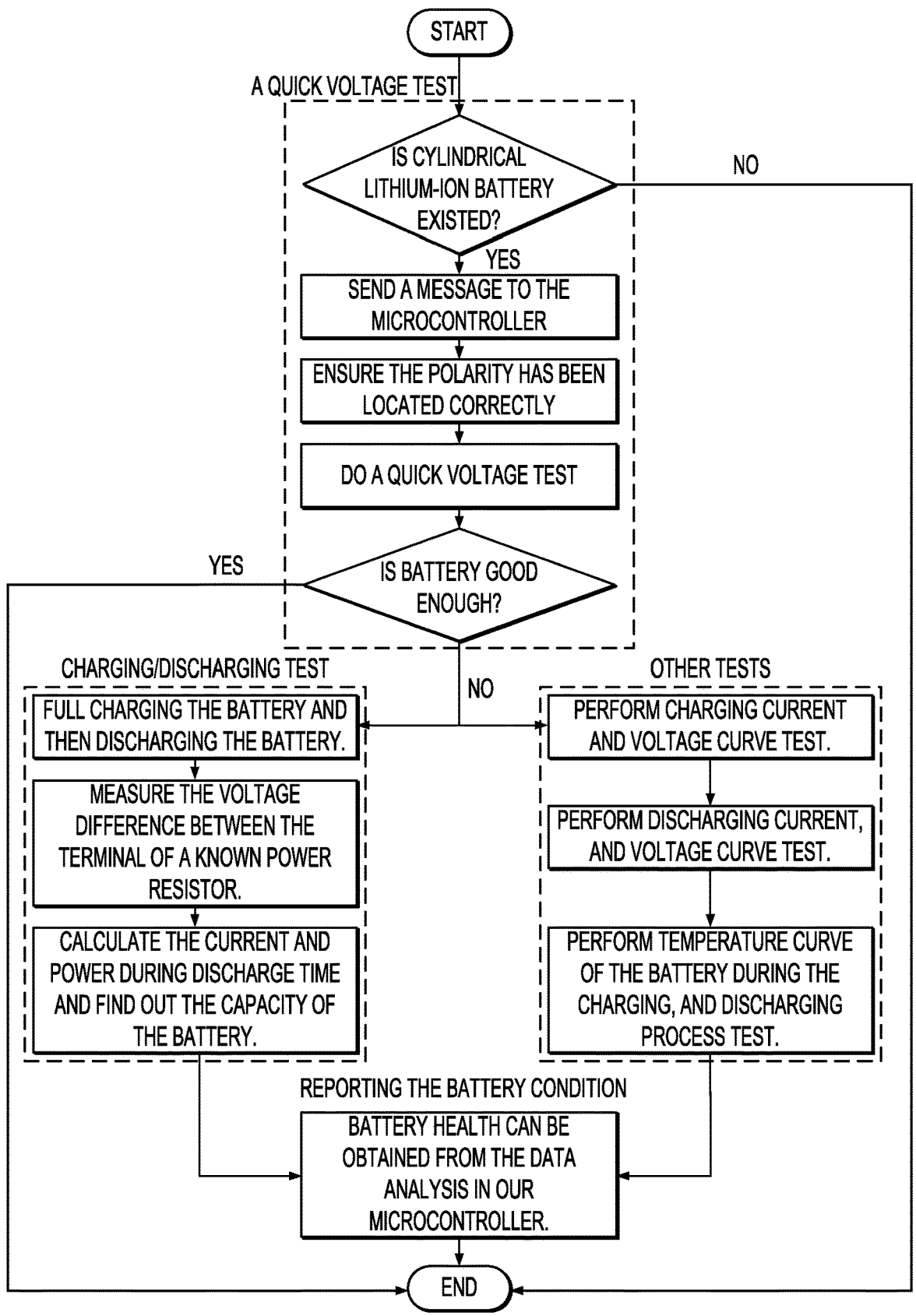
FIG. 2 shows a flowchart of the provided solution and what difference it will make on the lithium-ion battery life cycle.
Figure 3:
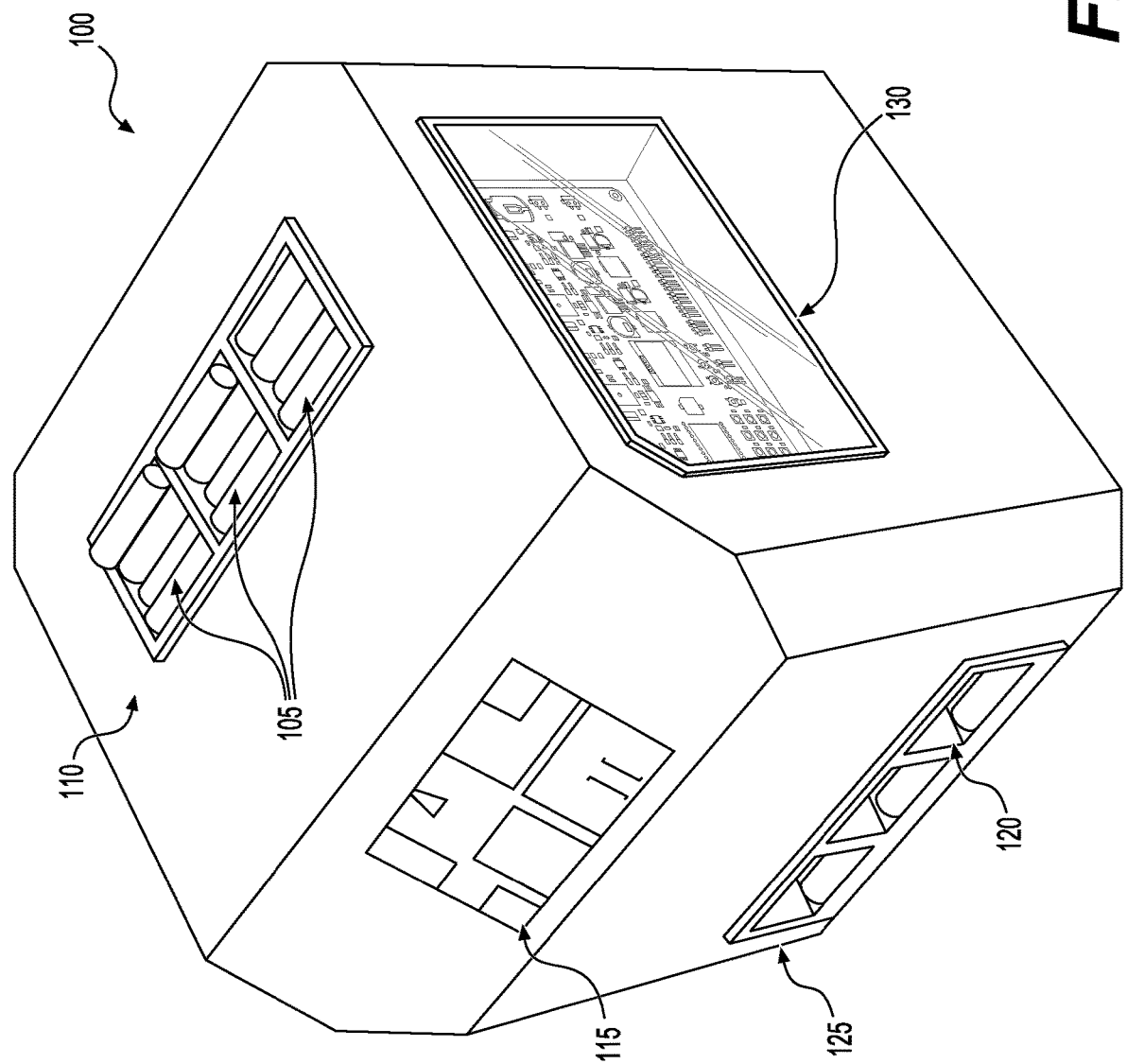
FIG. 3 shows an overall view of the lithium-ion battery analyzer.
Figure 4:
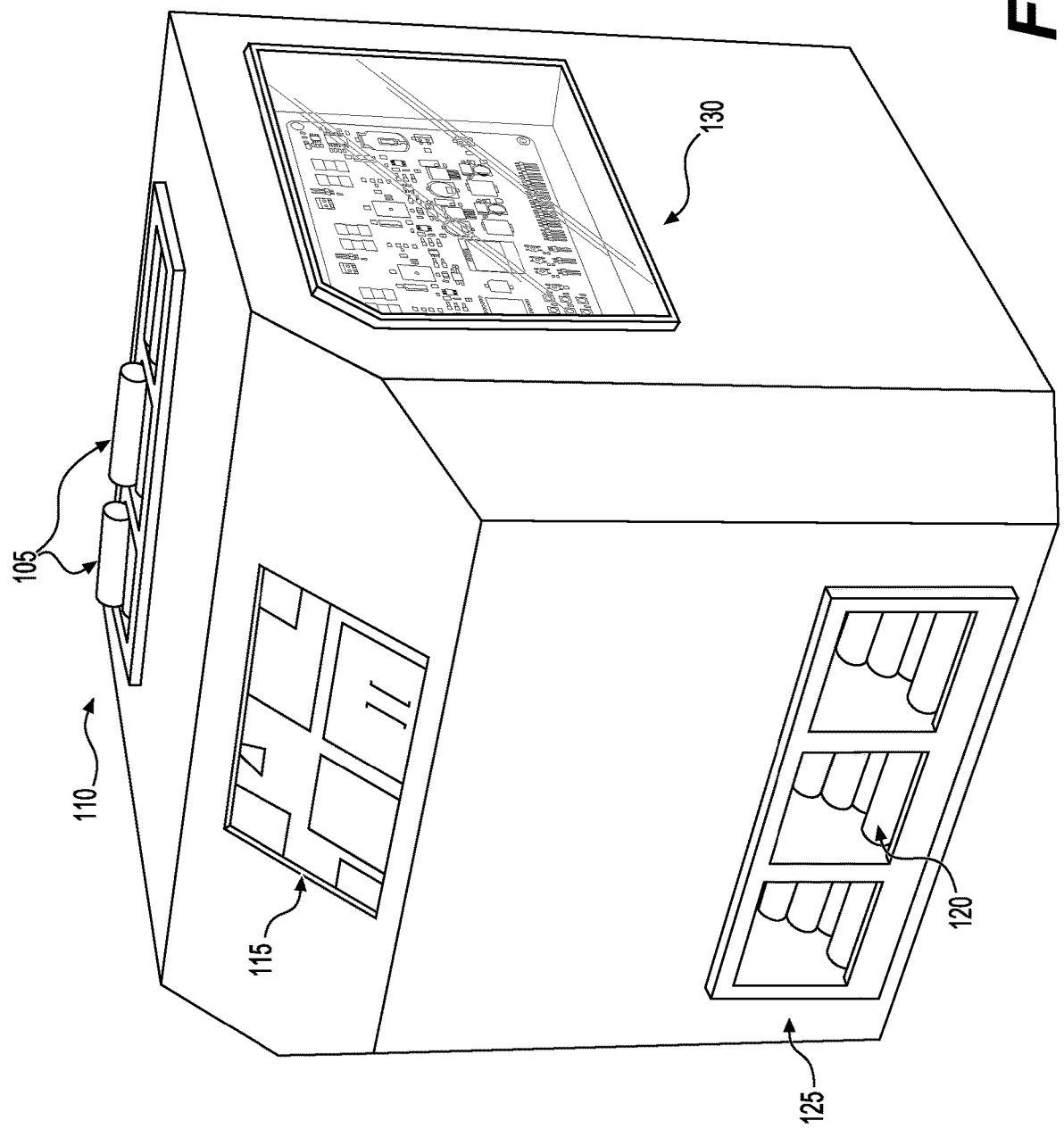
FIG. 4 shows a front view of the lithium-ion battery analyzer.
Figure 5:
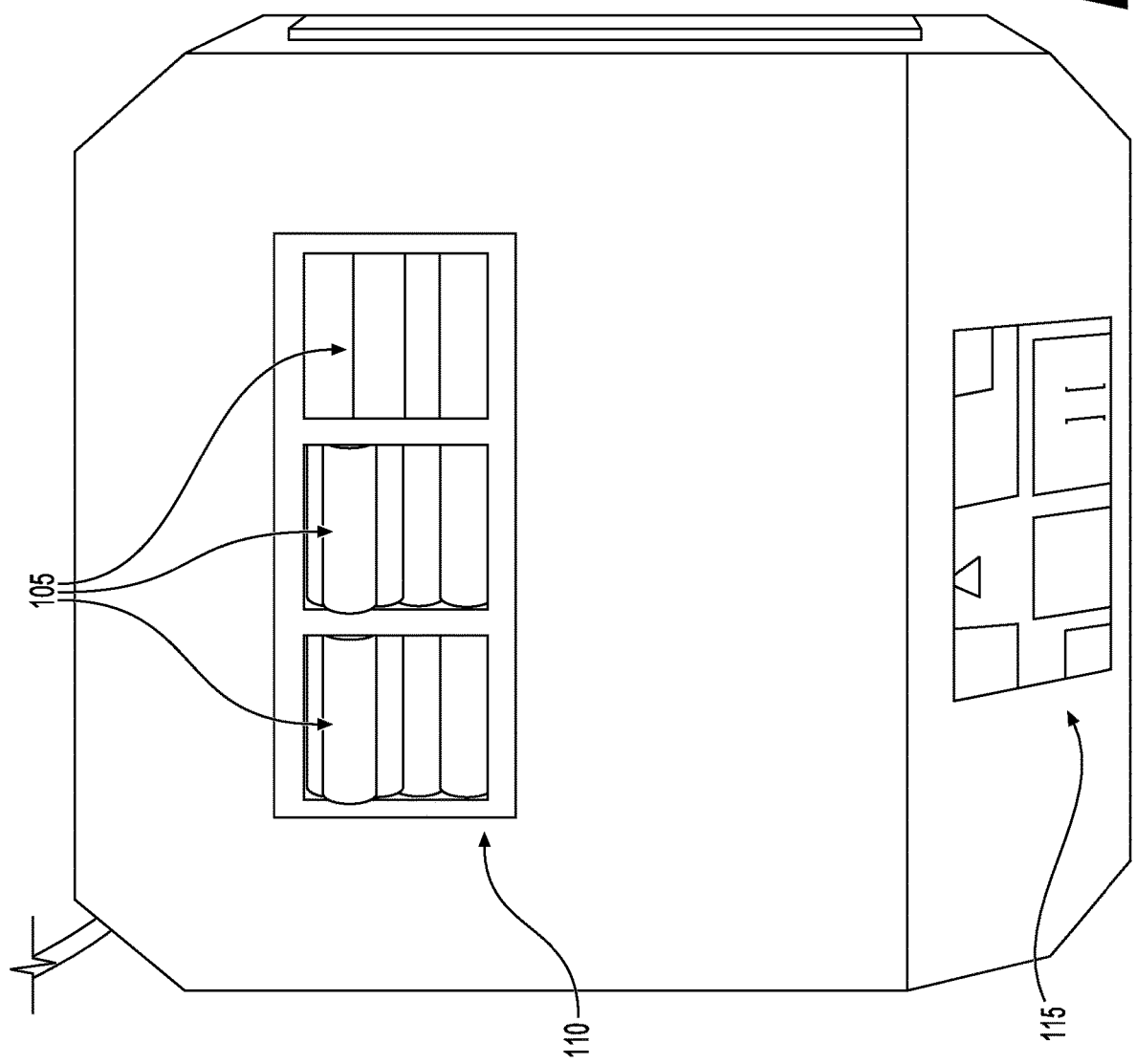
FIG. 5 shows a top view of the lithium-ion battery analyzer.
Figure 6:
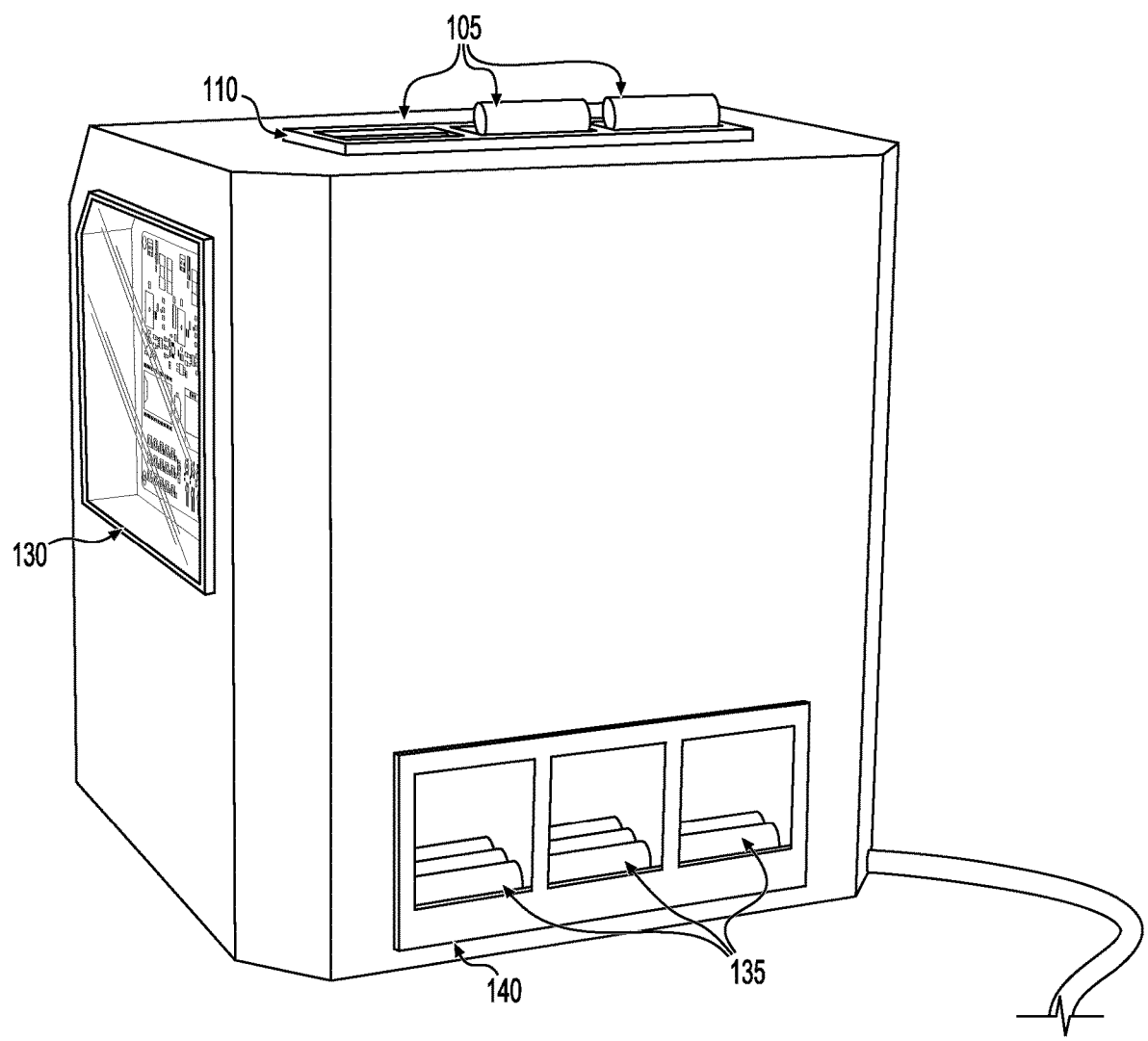
FIG. 6 shows a back view of the lithium-ion battery analyzer.
Figure 7:
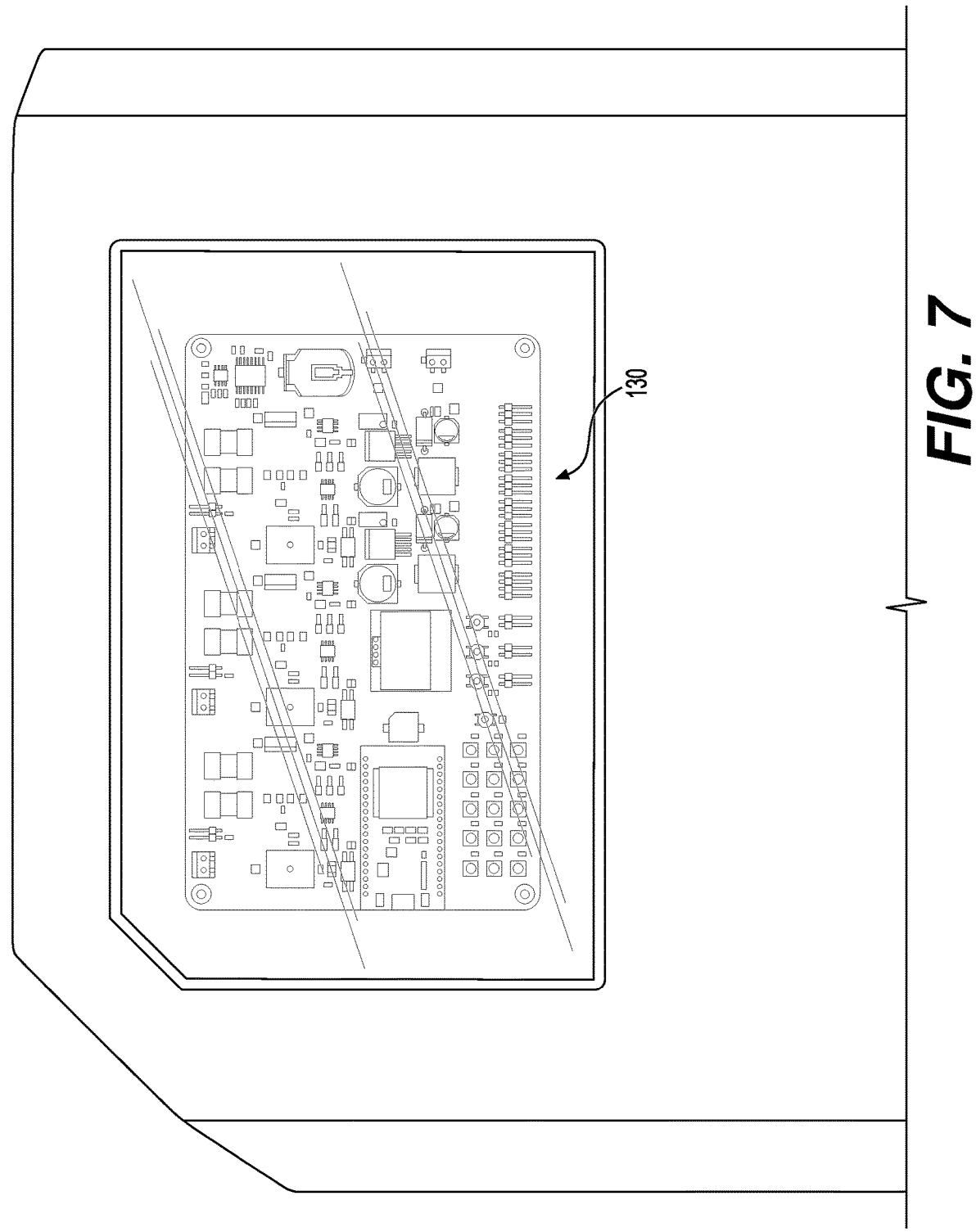
FIG. 7 shows a close-up view of the side of the lithium-ion battery analyzer with a motherboard therein.
Figure 8:
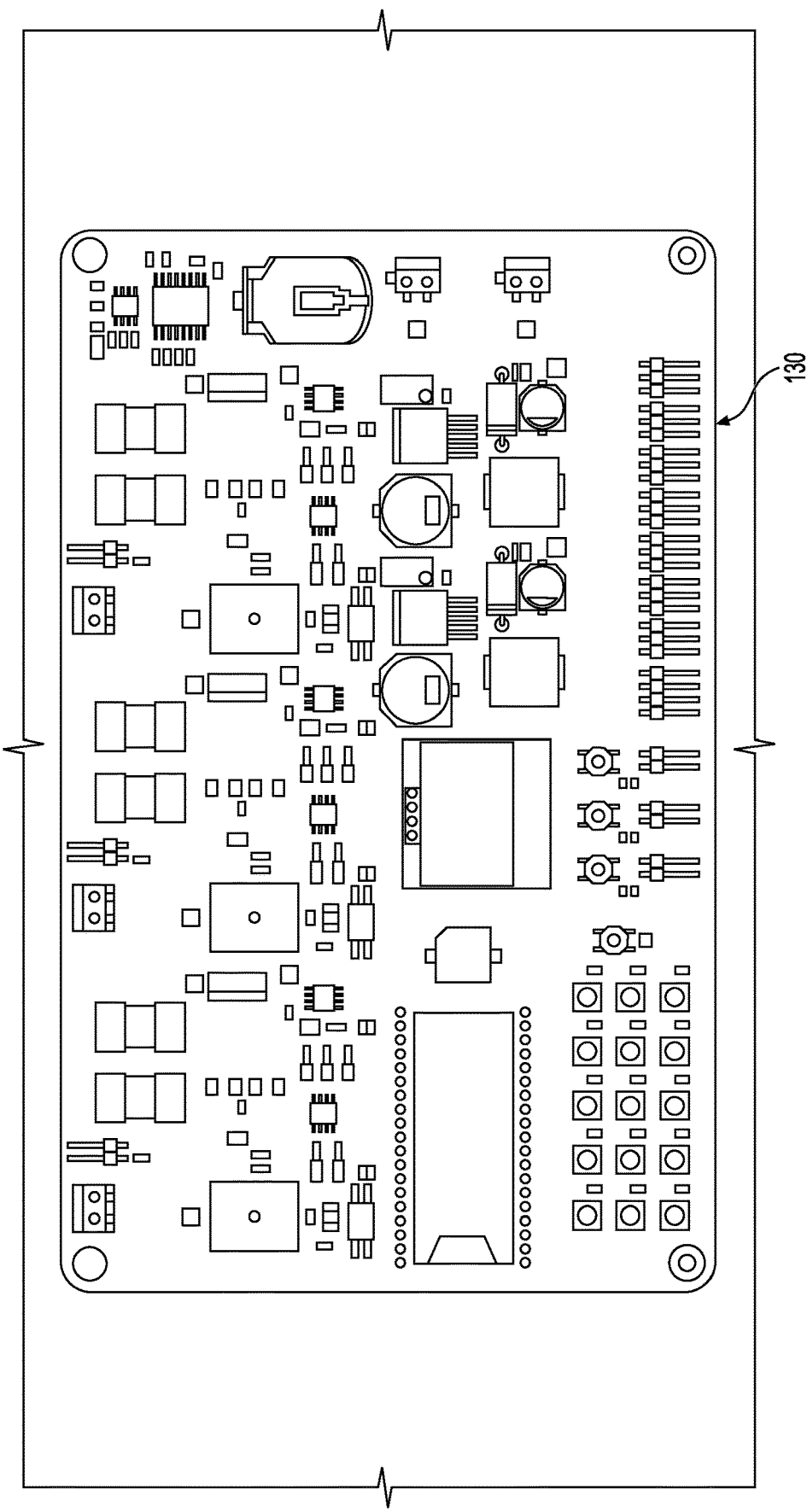
FIG. 8 shows the motherboard that that is also shown in FIG. 7.
Figure 9:
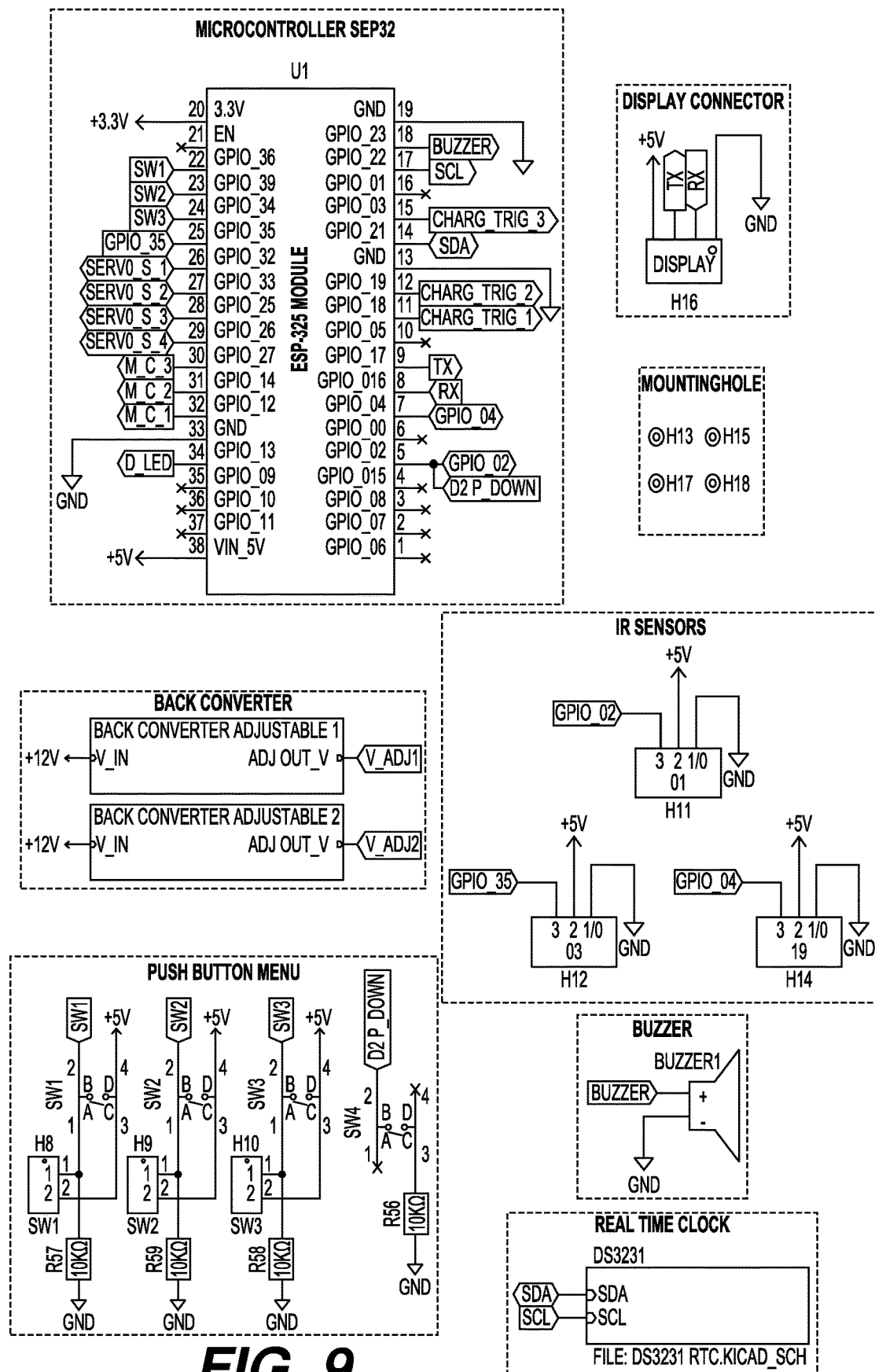
FIG. 9 shows a main electrical schematic diagram for the lithium-ion battery analyzer.
Figure 9:
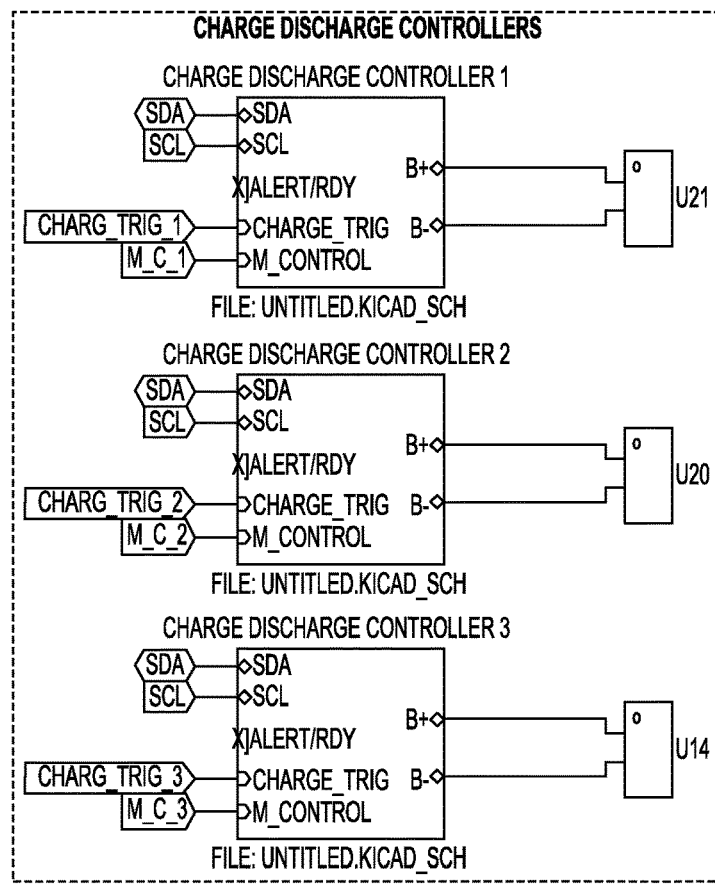
Figure 9:
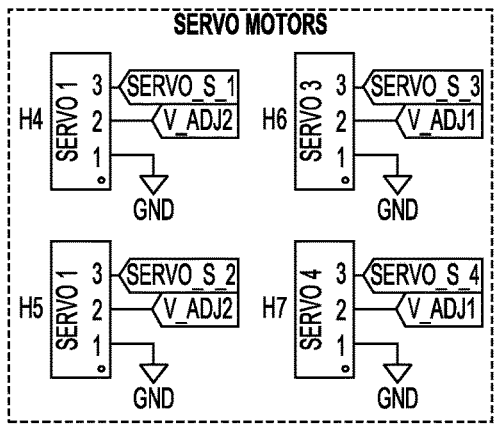
Figure 9:
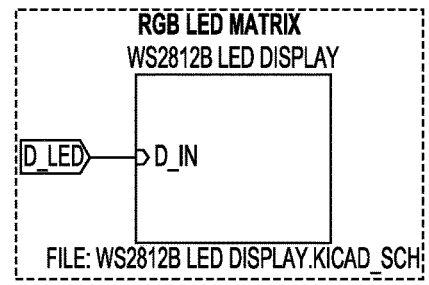
Figure 9:
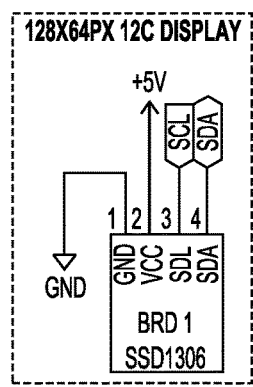
Figure 9:
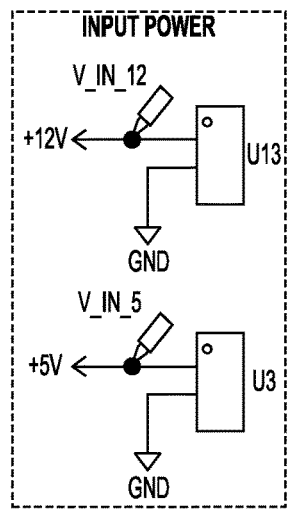
Figure 10:
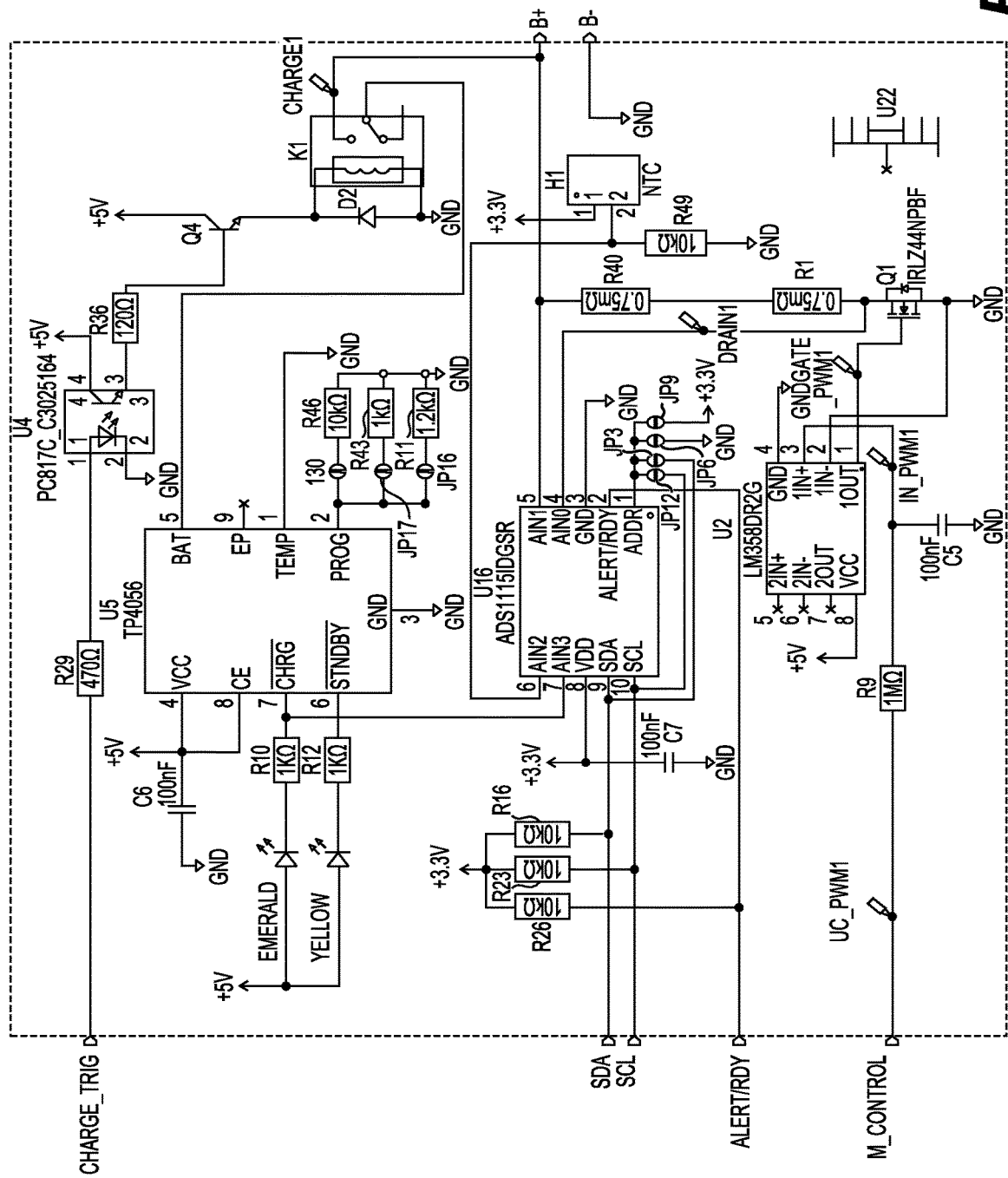
FIG. 10 shows details of a charge discharge controller 1 as shown in FIG. 9 for the lithium-ion battery analyzer.
Figure 11:
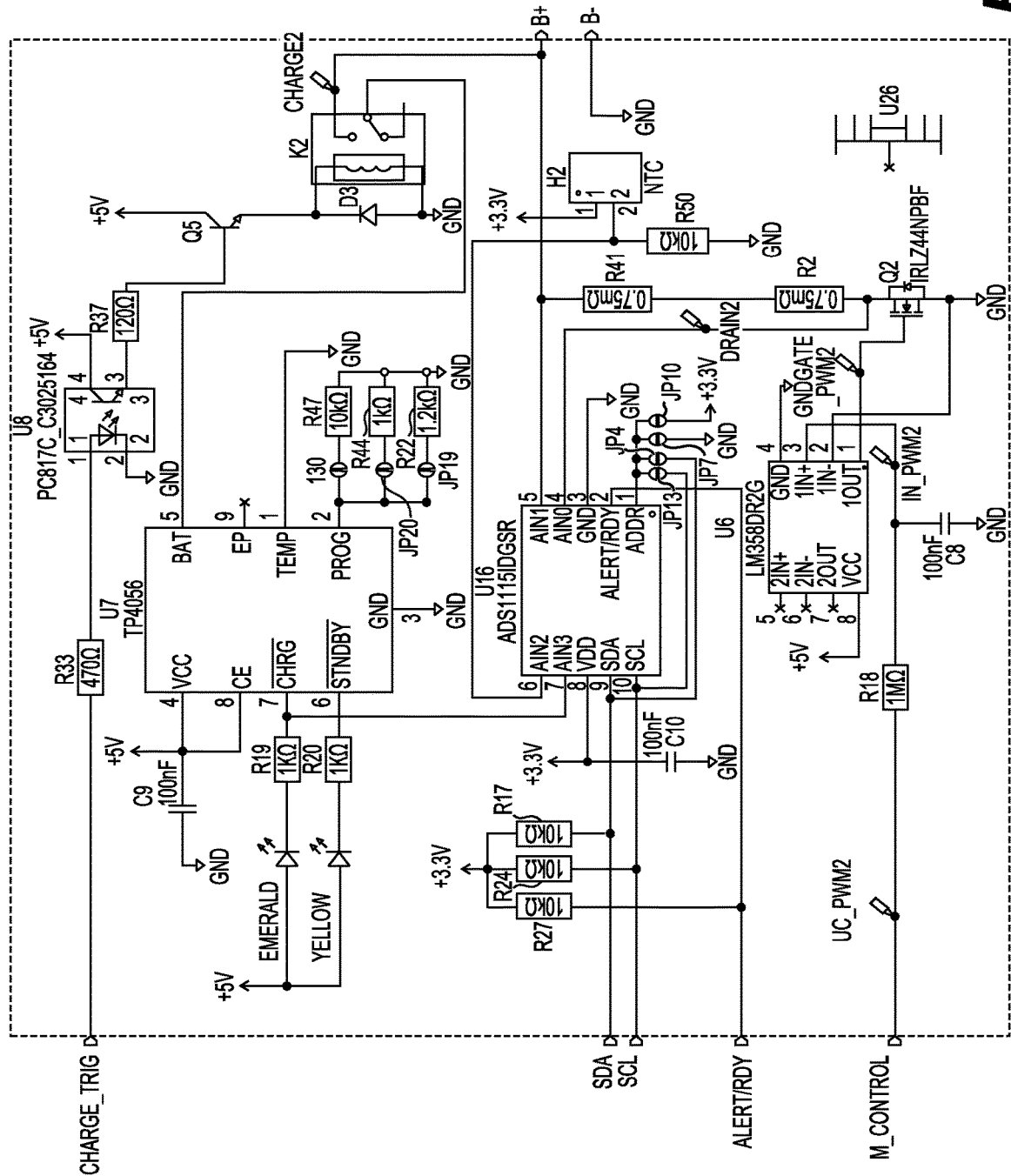
FIG. 11 shows details of a charge discharge controller 2 as shown in FIG. 9 for the lithium-ion battery analyzer.
Figure 12:
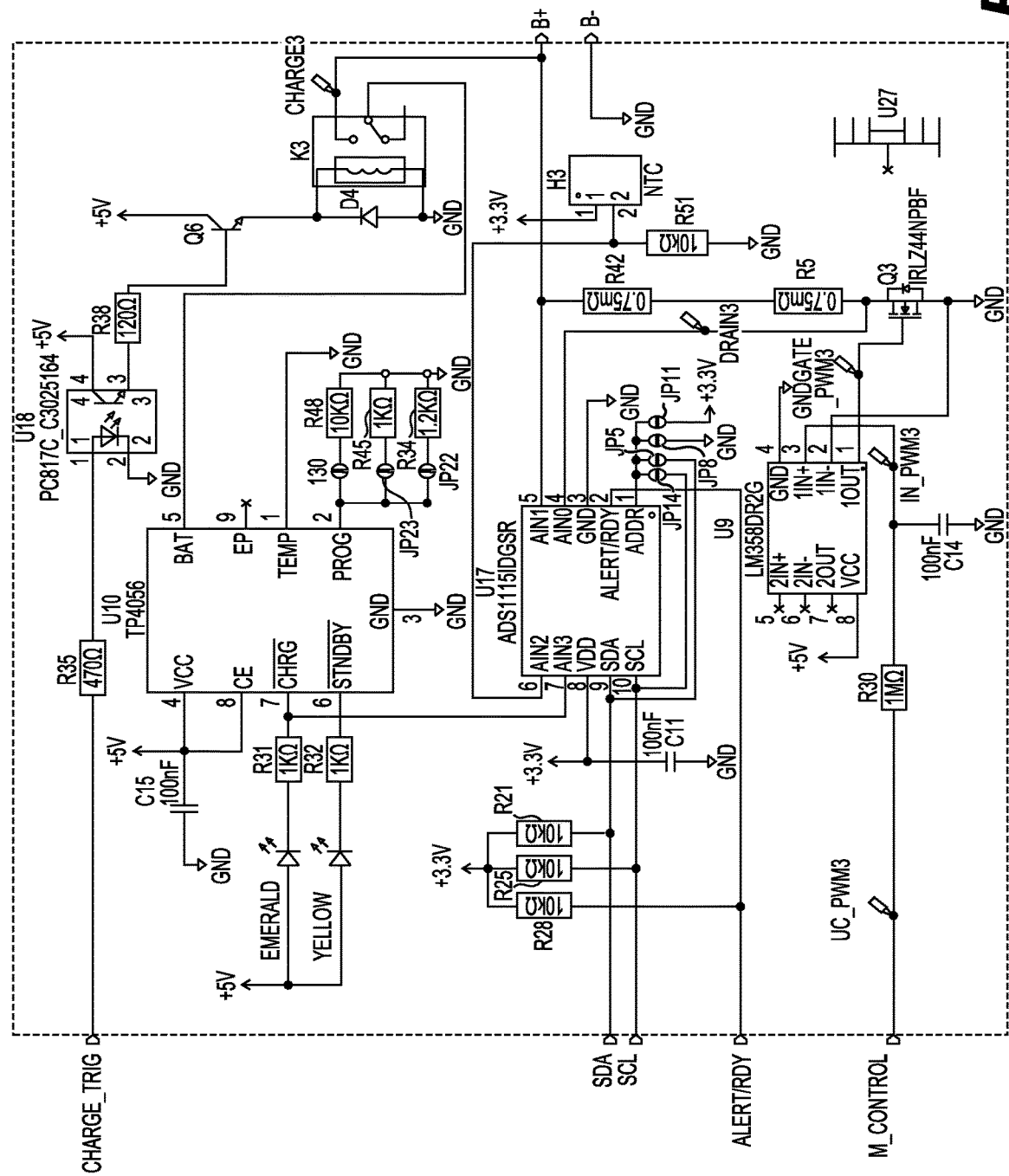
FIG. 12 shows details of a charge discharge controller 3 as shown in FIG. 9 for the lithium-ion battery analyzer.
Figure 13:
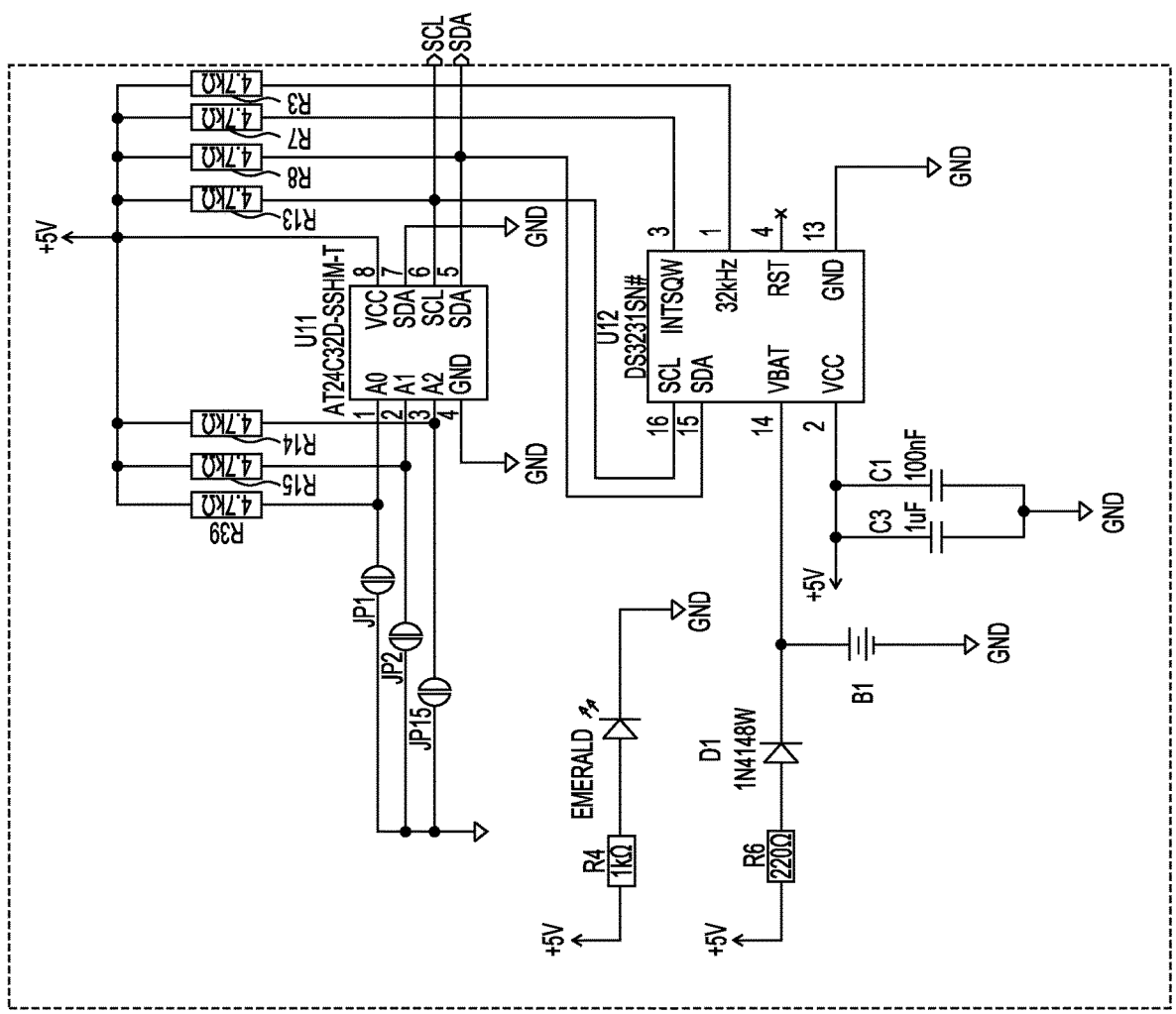
FIG. 13 shows details of a DS3231 RTC as shown in FIG. 9 for the lithium-ion battery analyzer.
Figure 14:
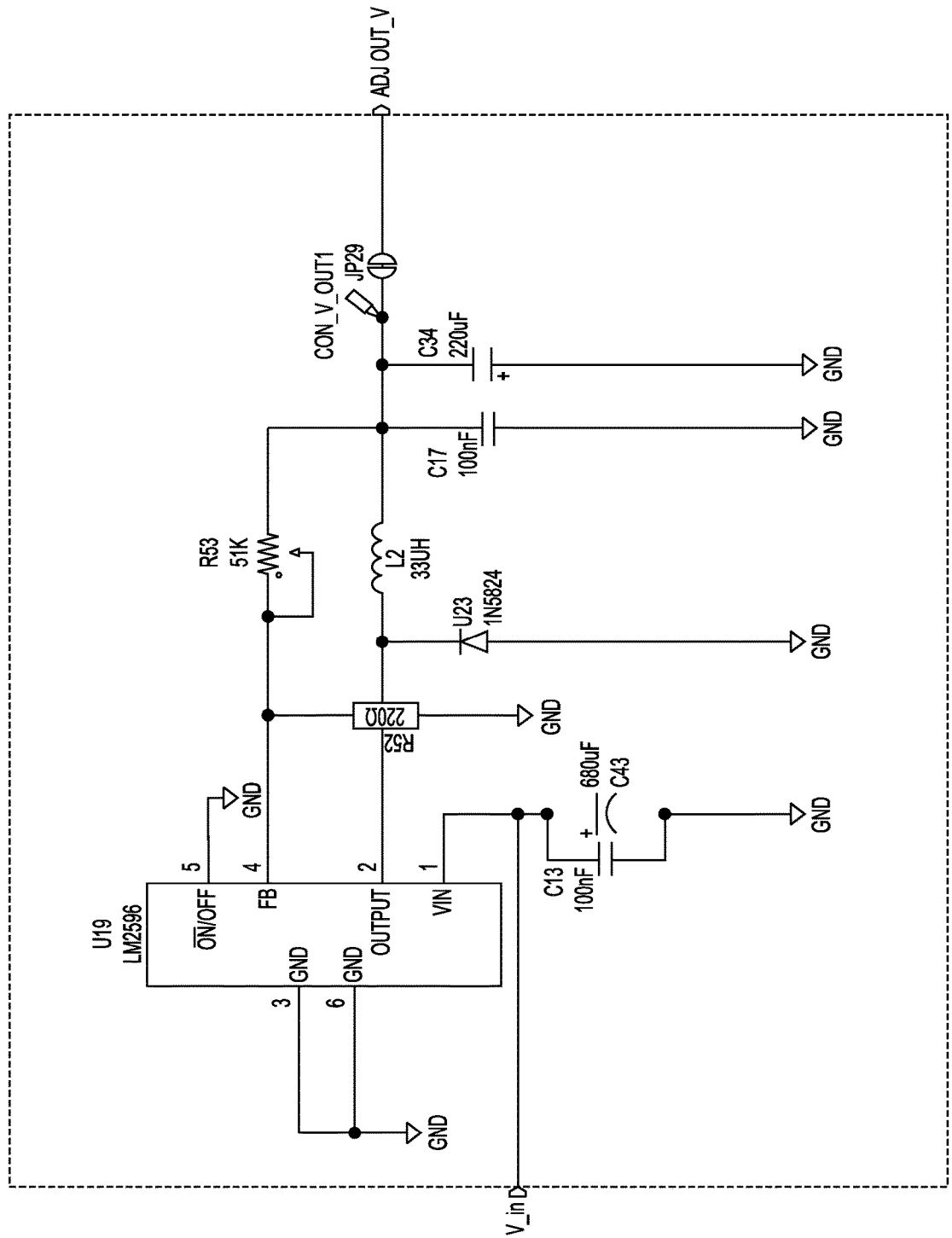
FIG. 14 shows details of a back converter adjustable 2 as shown in FIG. 9 for the lithium-ion battery analyzer.
Figure 15:
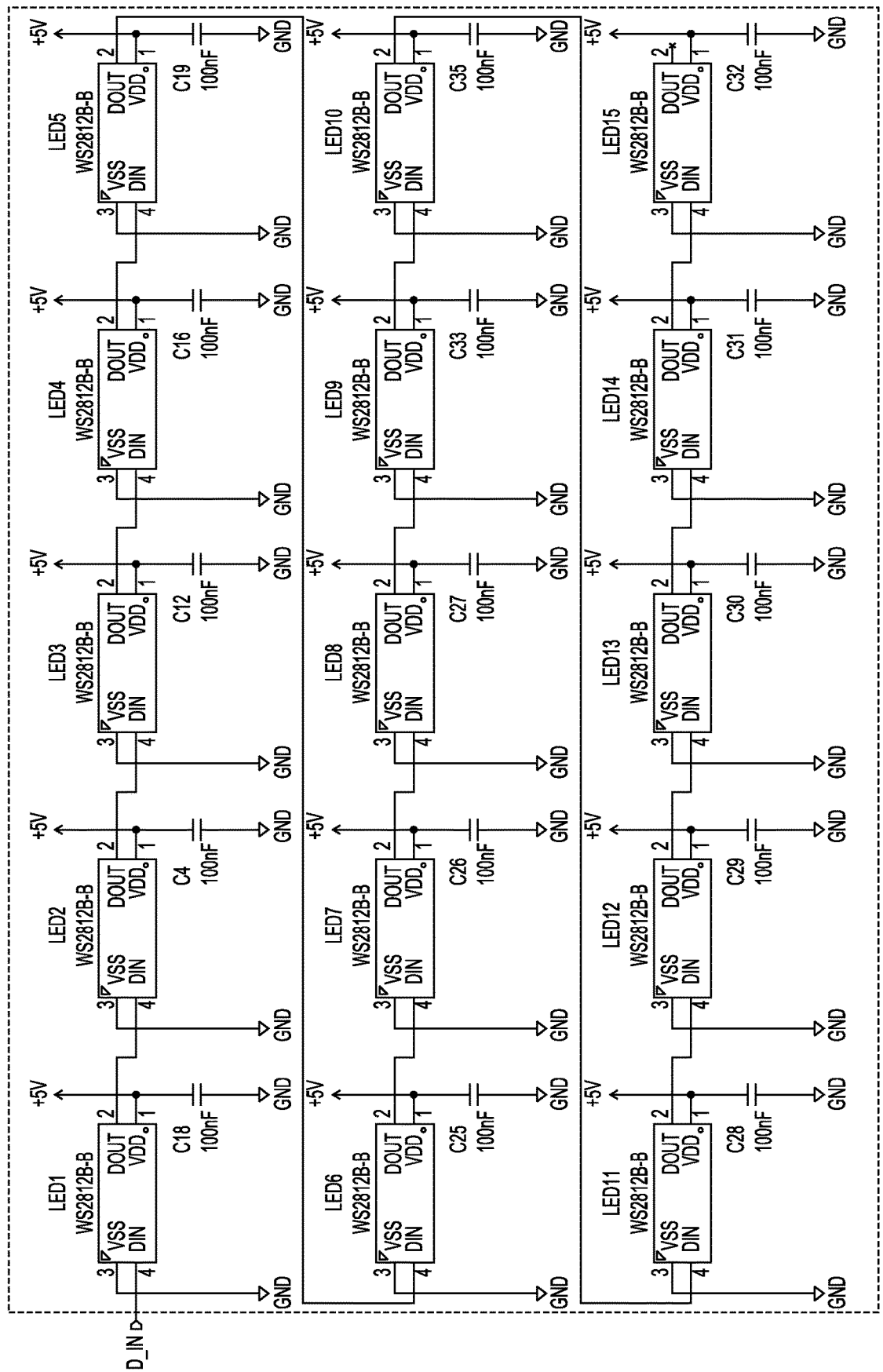
FIG. 15 shows details of a WS2812B LED display as shown in FIG. 9 for the lithium-ion battery analyzer.
Figure 16:
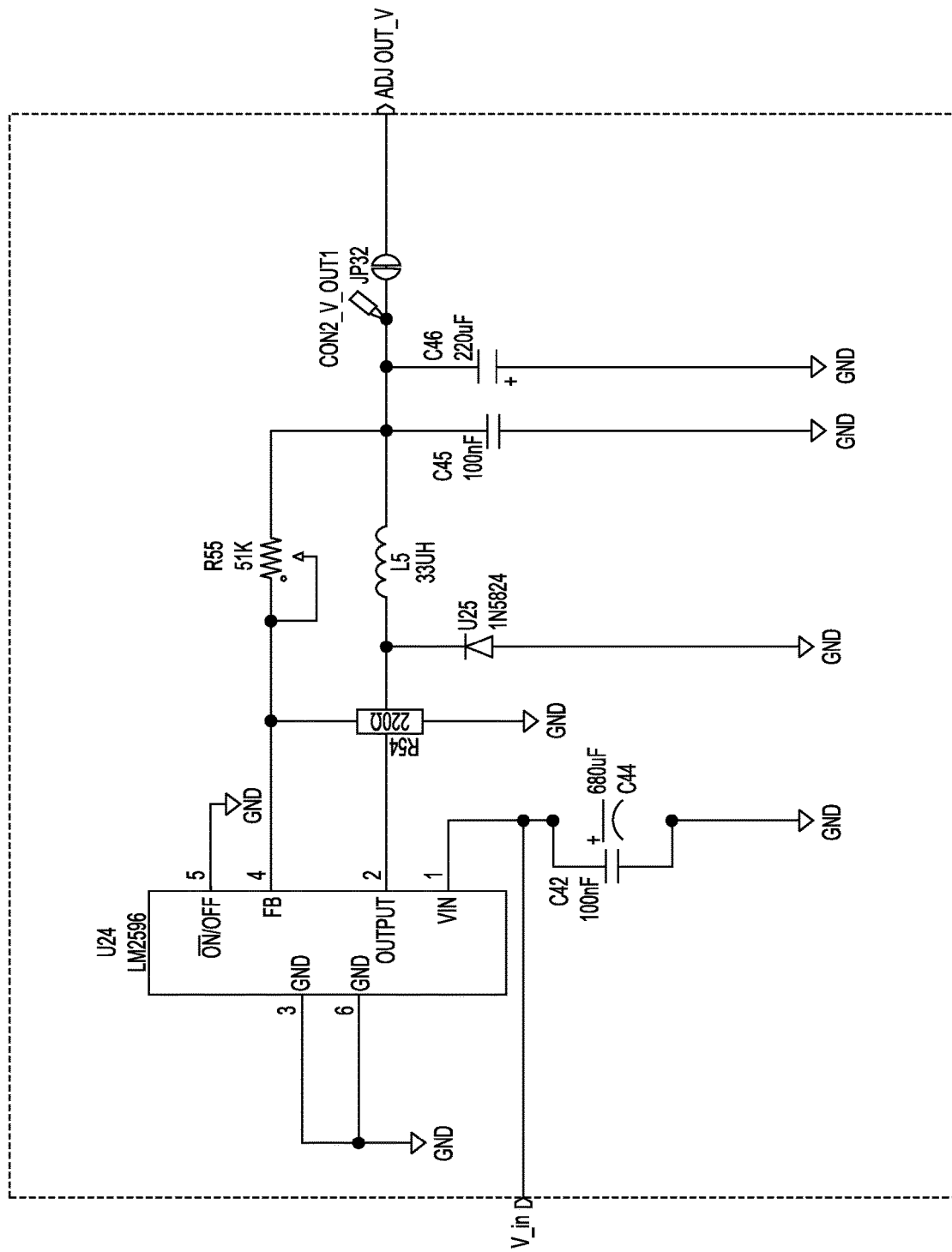
FIG. 16 shows details of a back converter adjustable 1 as shown in FIG. 9 for the lithium-ion battery analyzer.

The details of this process can be seen in FIG. 2, and is detailed further below.

Accordingly, the present subject matter relates to method of determining battery health of a cylindrical lithium-ion battery (105), the method comprising: visually inspecting the cylindrical lithium-ion battery (105) for liquid leakage; discarding the cylindrical lithium-ion battery (105) if the cylindrical lithium-ion battery (105) is determined to have liquid leakage and restarting the method with another cylindrical lithium-ion battery (105); inserting the cylindrical lithium-ion battery (105) inside a lithium-ion battery analyzer device (100); detecting for a presence of the cylindrical lithium-ion battery (105) in the lithium-ion battery analyzer device (100) via an IR sensor housed within the lithium-ion battery analyzer device (100); sending a detection message from the IR sensor to a microcontroller; moving the cylindrical lithium-ion battery (105) to connect to a positive terminal and a negative terminal of the lithium-ion battery analyzer device (100); performing a voltage test on the cylindrical lithium-ion battery (105) to determine if the cylindrical lithium-ion battery (105) is still capable of holding a charge; discarding the cylindrical lithium-ion battery (105) if the determination result is that the cylindrical lithium-ion battery (105) cannot hold a charge and restarting the method with a different cylindrical lithium-ion battery (105); fully charging and then discharging the cylindrical lithium-ion battery (105) while measuring a voltage difference between the positive terminal and the negative terminal of the cylindrical lithium-ion battery (105); measuring a voltage difference between a positive terminal and a negative terminal of a known power resistor during the discharging step; calculating and comparing current and power during time for completion of the discharging steps of the cylindrical lithium-ion battery (105) and the known power resistor to determine charge capacity of the cylindrical lithium-ion battery (105); performing additional tests on the cylindrical lithium-ion battery (105) during the charging and discharging; and analyzing all results of the additional tests via the microcontroller to determine the battery health of the cylindrical lithium-ion battery (105).

In another embodiment, this method can further comprise labeling the cylindrical lithium-ion battery (105) as capable of being reused if all test results of the above tests are above a preset threshold.

In another embodiment, the present subject matter relates to a method of selecting a cylindrical lithium-ion battery (105) having remaining usable battery life, the method comprising: visually inspecting the cylindrical lithium-ion battery (105) for liquid leakage; discarding the cylindrical lithium-ion battery (105) if the cylindrical lithium-ion battery (105) is determined to have liquid leakage and restarting the method with another cylindrical lithium-ion battery (105); inserting the cylindrical lithium-ion battery (105) inside a lithium-ion battery analyzer device (100); detecting for a presence of the cylindrical lithium-ion battery (105) in the lithium-ion battery analyzer device (100) via an IR sensor housed within the lithium-ion battery analyzer device (100); sending a detection message from the IR sensor to a microcontroller; moving the cylindrical lithium-ion battery (105) to connect to a positive terminal and a negative terminal of the lithium-ion battery analyzer device (100); performing a voltage test on the cylindrical lithium-ion battery (105) to determine if the cylindrical lithium-ion battery (105) is still capable of holding a charge; discarding the cylindrical lithium-ion battery (105) if the determination result is that the cylindrical lithium-ion battery (105) cannot hold a charge and restarting the method with a different cylindrical lithium-ion battery (105); fully charging and then discharging the cylindrical lithium-ion battery (105) while measuring a voltage difference between the positive terminal and the negative terminal of the cylindrical lithium-ion battery (105); measuring a voltage difference between a positive terminal and a negative terminal of a known power resistor during the discharging step; calculating and comparing current and power during time for completion of the discharging steps of the cylindrical lithium-ion battery (105) and the known power resistor to determine charge capacity of the cylindrical lithium-ion battery (105); performing additional tests on the cylindrical lithium-ion battery (105) during the charging and discharging; analyzing all results of the additional tests via the microcontroller to determine a battery health of the cylindrical lithium-ion battery (105); and selecting the cylindrical lithium-ion battery (105) for further use if the battery health of the cylindrical lithium-ion battery is above a preset threshold.

In an embodiment of the present methods, the additional tests performed on the cylindrical lithium-ion battery (105) can be selected from the group consisting of charging current and voltage curve, discharging current and voltage curve, and temperature curve of the cylindrical lithium-ion battery (105) during the charging and discharging steps.

In a further embodiment of the present methods, before performing the voltage test, a further step of confirming that a polarity of the cylindrical lithium-ion battery (105) has been correctly located can be performed.

In an additional embodiment of the present methods, the fully charging and discharging of the cylindrical lithium-ion battery (105) can be conducted using a balanced charging IC with constant current control.

In another embodiment, the present methods can further comprise labeling the cylindrical lithium-ion battery (105) with a temperature that the cylindrical lithium-ion battery can adapt to and an appropriate temperature environment for the cylindrical lithium-ion battery (105) from the temperature curve of the cylindrical lithium-ion battery (105) during the charging and discharging.

In an embodiment, the battery health of the cylindrical lithium-ion battery (105) can include a calculation of efficiency of the cylindrical lithium-ion battery (105).

In a further embodiment, the battery health of the cylindrical lithium-ion battery (105) can include a calculation of an approximate time period until the cylindrical lithium-ion battery (105) becomes unusable.

In an additional embodiment, the lithium-ion battery analyzer device (100) can use a constant current or a variable current for performing testing.

In another embodiment, the lithium-ion battery analyzer device (100) can include a touch screen (115) for displaying the battery health of the cylindrical lithium-ion battery (105). In this regard, the touch screen (115) can display the capacity of the cylindrical lithium-ion battery (105) while charging and after completion of the discharging. Similarly, the charging current and voltage curve, the discharging current and voltage curve, and the temperature curve of the cylindrical lithium-ion battery (105) during the charging and discharging can be displayed on the touch screen (115) included on the lithium-ion battery analyzer device (100).

In another embodiment, the lithium-ion battery analyzer device (100) can be connected to the internet, permitting control of the device either on site or remotely, and display of the information obtained from the present methods either on the integrated touch screen or at a remote workstation or device.

In certain embodiments, the microcontroller in the lithium-ion battery analyzer device (100) may comprise a general-purpose computer, or the like and an associated program store containing software instructions which, when executed by the microcontroller can cause the microcontroller to operate as described herein. In the alternative, the microcontroller may comprise a field programmable gate array (FPGA), application specific integrated circuit, or the like configured to execute the methods as described herein.

Control signals can be used to cause the lithium-ion battery analyzer (100) to take measurements of electrochemical parameters of the cylindrical lithium-ion battery (105) and to convey those electrochemical parameters to the microcontroller in the form of digitized signals. Those skilled in the art are aware of a wide variety of suitable means for obtaining electrochemical parameters of a battery under testing including many such means which are described in the worldwide patent literatures.

The microcontroller can compute and display on the touch screen (115) and/or store in a data store associated with the microcontroller an assessment of the battery health.

It will be appreciated that the basic methods and apparatus herein can be applied in situations where different sets of electrochemical parameters are measured. Further, the mechanism by which the electrochemical parameters are measured does not affect the operation of assessing the battery's health. All that is required is some measuring means for measuring a set of electrochemical parameters of a battery which is sufficient to characterize the health of the battery. The measuring means is preferably software configurable.

Certain implementations herein can comprise computers running software instructions which cause the computers to execute a present method. The current subject matter may also be provided in the form of a program product. The program product may comprise any medium which carries a set of computer-readable signals containing to instructions which, when run by a computer, cause the computer to execute a present method. The program product may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

The devices and methods described herein are notable in that they can include an easy user interface, be made at low cost, conduct fast battery testing with accurate measurements, support multiple measurements such as internal resistance and capacity tests, follow safety system protocols, have an online control panel, and perform visual and electrical tests.

It is to be understood that the devices and methods are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method of determining battery health of a cylindrical lithium-ion battery, the method comprising:
   visually inspecting the cylindrical lithium-ion battery for liquid leakage;
   discarding the cylindrical lithium-ion battery if the cylindrical lithium-ion battery is determined to have liquid leakage and restarting the method with another cylindrical lithium-ion battery;
   inserting the cylindrical lithium-ion battery inside a lithium-ion battery analyzer device;
   detecting for a presence of the cylindrical lithium-ion battery in the lithium-ion battery analyzer device via an IR sensor housed within the lithium-ion battery analyzer device;
   sending a detection message from the IR sensor to a microcontroller;
   moving the cylindrical lithium-ion battery to connect to a positive terminal and a negative terminal of the lithium-ion battery analyzer device;
   performing a voltage test on the cylindrical lithium-ion battery to determine if the cylindrical lithium-ion battery is still capable of holding a charge;
   discarding the cylindrical lithium-ion battery if the determination result is that the cylindrical lithium-ion battery cannot hold a charge and restarting the method with a different cylindrical lithium-ion battery;
   fully charging and then discharging the cylindrical lithium-ion battery while measuring a voltage difference between the positive terminal and the negative terminal of the cylindrical lithium-ion battery;
   measuring a voltage difference between a positive terminal and a negative terminal of a known power resistor during the discharging step;
   calculating and comparing current and power during time for completion of the discharging steps of the cylindrical lithium-ion battery and the known power resistor to determine charge capacity of the cylindrical lithium-ion battery;
   performing additional tests on the cylindrical lithium-ion battery during the charging and discharging;
   analyzing all results of the additional tests via the microcontroller to determine the battery health of the cylindrical lithium-ion battery; and
   reusing the cylindrical lithium-ion battery if all tests are above a preset threshold.

2. The method of determining battery health of a cylindrical lithium-ion battery of claim 1, wherein the additional tests are selected from the group consisting of charging current and voltage curve, discharging current and voltage curve, and temperature curve of the cylindrical lithium-ion battery during the charging and discharging.

3. The method of determining battery health of a cylindrical lithium-ion battery of claim 2, further comprising labeling the cylindrical lithium-ion battery with a temperature that the cylindrical lithium-ion battery can adapt to and an appropriate temperature environment for the cylindrical lithium-ion battery from the temperature curve of the cylindrical lithium-ion battery during the charging and discharging.

4. The method of determining battery health of a cylindrical lithium-ion battery of claim 2, wherein the charging current and voltage curve, the discharging current and voltage curve, and the temperature curve of the cylindrical lithium-ion battery during the charging and discharging are displayed on a touch screen included in the lithium-ion battery analyzer device.

5. The method of determining battery health of a cylindrical lithium-ion battery of claim 1, wherein, before performing the voltage test, a further step of confirming a polarity of the cylindrical lithium-ion battery has been correctly located is performed.

6. The method of determining battery health of a cylindrical lithium-ion battery of claim 1, wherein the fully charging and discharging the cylindrical lithium-ion battery is conducted using a balanced charging IC with constant current control.

7. The method of determining battery health of a cylindrical lithium-ion battery of claim 1, wherein the battery health of the cylindrical lithium-ion battery includes a calculation of efficiency of the cylindrical lithium-ion battery.

8. The method of determining battery health of a cylindrical lithium-ion battery of claim 1, wherein the battery health of the cylindrical lithium-ion battery includes a calculation of an approximate time period until the cylindrical lithium-ion battery becomes unusable.

9. The method of determining battery health of a cylindrical lithium-ion battery of claim 1, wherein the lithium-ion battery analyzer device uses a constant current or a variable current for performing testing.

10. The method of determining battery health of a cylindrical lithium-ion battery of claim 1, wherein the lithium-ion battery analyzer device includes a touch screen for displaying the battery health of the cylindrical lithium-ion battery.

11. The method of determining battery health of a cylindrical lithium-ion battery of claim 10, wherein the touch screen displays the capacity of the cylindrical lithium-ion battery while charging and after completion of the discharging.

12. A method of selecting a cylindrical lithium-ion battery having remaining usable battery life, the method comprising:
- visually inspecting the cylindrical lithium-ion battery for liquid leakage;
- discarding the cylindrical lithium-ion battery if the cylindrical lithium-ion battery is determined to have liquid leakage and restarting the method with another cylindrical lithium-ion battery;
- inserting the cylindrical lithium-ion battery inside a lithium-ion battery analyzer device;
- detecting for a presence of the cylindrical lithium-ion battery in the lithium-ion battery analyzer device via an IR sensor housed within the lithium-ion battery analyzer device;
- sending a detection message from the IR sensor to a microcontroller;
- moving the cylindrical lithium-ion battery to connect to a positive terminal and a negative terminal of the lithium-ion battery analyzer device;
- performing a voltage test on the cylindrical lithium-ion battery to determine if the cylindrical lithium-ion battery is still capable of holding a charge;
- discarding the cylindrical lithium-ion battery if the determination result is that the cylindrical lithium-ion battery cannot hold a charge and restarting the method with a different cylindrical lithium-ion battery;
- fully charging and then discharging the cylindrical lithium-ion battery while measuring a voltage difference between the positive terminal and the negative terminal of the cylindrical lithium-ion battery;
- measuring a voltage difference between a positive terminal and a negative terminal of a known power resistor during the discharging step;
- calculating and comparing current and power during time for completion of the discharging steps of the cylindrical lithium-ion battery and the known power resistor to determine charge capacity of the cylindrical lithium-ion battery;
- performing additional tests on the cylindrical lithium-ion battery during the charging and discharging;
- analyzing all results of the additional tests via the microcontroller to determine a battery health of the cylindrical lithium-ion battery;
- selecting the cylindrical lithium-ion battery for further use if the battery health of the cylindrical lithium-ion battery is above a preset threshold;
- labeling the cylindrical lithium-ion battery as capable of being reused if the battery health of the cylindrical lithium-ion battery is above the preset threshold; and
- reusing the cylindrical lithium-ion battery if all tests are above a preset threshold.

* * * * *